United States Patent
Johnson et al.

(10) Patent No.: US 9,348,231 B2
(45) Date of Patent: May 24, 2016

(54) CONTINUOUSLY PRODUCING DIGITAL MICRO-SCALE PATTERNS ON A THIN POLYMER FILM

(71) Applicant: Palo Alto Research Center Incorporated, Palo Alto, CA (US)

(72) Inventors: David Mathew Johnson, San Francisco, CA (US); Armin R. Volkel, Mountain View, CA (US); John Steven Paschkewitz, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 286 days.

(21) Appl. No.: 13/944,843

(22) Filed: Jul. 17, 2013

(65) Prior Publication Data
US 2015/0022790 A1    Jan. 22, 2015

(51) Int. Cl.
| | | |
|---|---|---|
| *B05C 9/08* | (2006.01) | |
| *G03G 13/10* | (2006.01) | |
| *G03F 7/20* | (2006.01) | |
| *B05C 9/12* | (2006.01) | |
| *B05C 5/00* | (2006.01) | |
| *G03F 7/00* | (2006.01) | |
| *G03G 15/02* | (2006.01) | |
| *B41F 16/00* | (2006.01) | |

(52) U.S. Cl.
CPC . *G03F 7/70* (2013.01); *B05C 5/005* (2013.01); *B05C 5/007* (2013.01); *B05C 9/08* (2013.01); *B05C 9/12* (2013.01); *G03F 7/0002* (2013.01); *B41F 16/00* (2013.01); *G03G 13/10* (2013.01); *G03G 15/02* (2013.01)

(58) Field of Classification Search
None
See application file for complete search history.

(56) References Cited

U.S. PATENT DOCUMENTS

| | | | | |
|---|---|---|---|---|
| 2,476,282 A | * | 7/1949 | Castellan | 118/620 |
| 4,166,089 A | * | 8/1979 | De Geest et al. | 264/466 |
| 7,163,611 B2 | | 1/2007 | Volkel et al. | |
| 2002/0005391 A1 | * | 1/2002 | Schaffer et al. | 427/457 |

OTHER PUBLICATIONS

Goldberg-Oppenheimer, P. et al. "Carbon Nanotube Alignment via Electrohydrodynamic Patterning of Nanocomposites", Advanced Functional Materials, vol. 21, No. 10, pp. 1895-1901 (2011).
Goldberg-Oppenheimer, P. et al. "Rapid Electrohydrodynamic Lithography Using Low-Viscosity Polymers", Small, vol. 6, No. 11, pp. 1248-1254, (2010).

(Continued)

*Primary Examiner* — Binu Thomas
(74) *Attorney, Agent, or Firm* — Bever, Hoffman & Harms, LLP

(57) ABSTRACT

A coating mechanism disposes a liquid (e.g., polymer) thin film onto a conveyor surface (e.g., roller or belt) that is moved by a suitable motor to convey the thin film into a precisely controlled gap (or nip) region where applied potentials generate an electric field that causes the liquid to undergo Electrohydrodynamic (EHD) patterning deformation, whereby the liquid forms patterned micro-scale features. A curing mechanism (e.g., a UV laser) is used to solidify (e.g., cross-link) the patterned liquid features inside or immediately after exiting the gap region, thereby forming micro-scale patterned structures that are either connected by an intervening web as part of a sheet, or separated into discrete micro-scale structures. Nanostructures (e.g., nanotubes or nanowires) disposed in the liquid become vertically oriented during the EHD patterning process. Segmented electrodes and patterned charges are utilized to provide digital patterning control.

18 Claims, 8 Drawing Sheets

(56) References Cited

OTHER PUBLICATIONS

Lau, C. Y., et al. "Fundamental Limitations on Ordered Electrohydrodynamic Patterning", Macromolecules, vol. 44, No. 19, pp. 7746-7751 (2011).

Li, X. et al. "Impovng the height of replication in EHD patterning by optimizing the electrical properties of the template", Journal of Micromechanics and Microengineering, vol. 21. No. 11, 115004, 7 pages (2001).

Schäffer, E. "Instabilities in Thin Polymer Films: Structure Formation and Pattern Transfer", Ph.D. Thesis, 139 pages (2001).

* cited by examiner

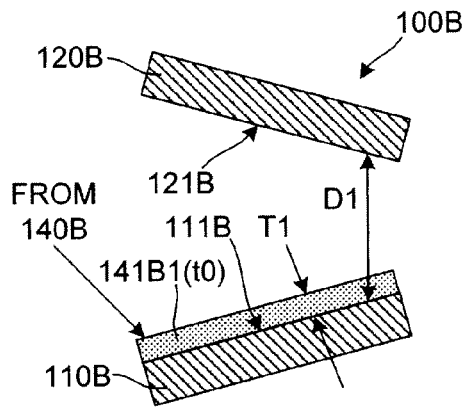
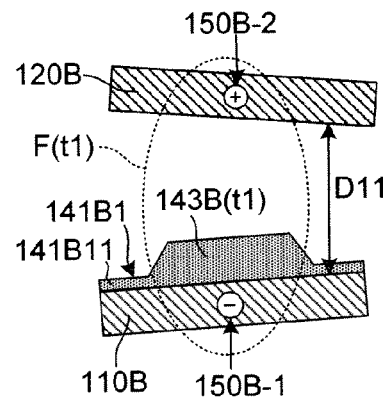
FIG. 4(A)　　　　　　　　　FIG. 4(B)
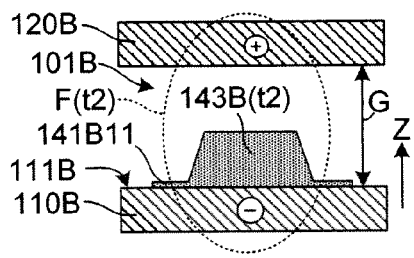
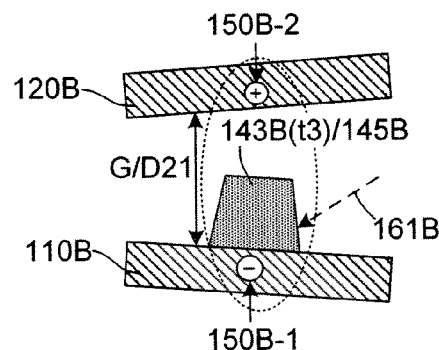
FIG. 4(C)　　　　　　　　　FIG. 4(D)
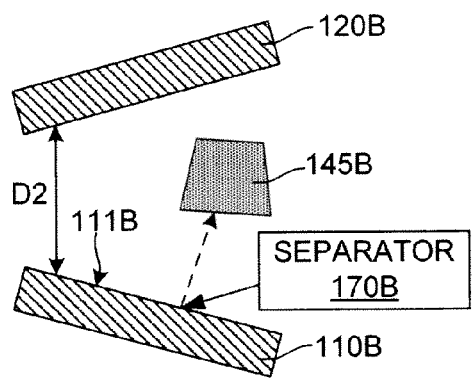
FIG. 4(E)

CONTINUOUSLY PRODUCING DIGITAL MICRO-SCALE PATTERNS ON A THIN POLYMER FILM

FIELD OF THE INVENTION

This invention relates to micro-scale patterned structures, and more particularly to systems for producing micro-scale patterned structures.

BACKGROUND OF THE INVENTION

There is a growing need for systems for producing thin polymer films with three-dimensional patterning at scales ranging from several microns to centimeters in industrially relevant quantities. Such patterned polymer thin films are useful, e.g., for optical applications (anti-reflective coatings and filters) and controlled wetting applications (hydrophobic and hydrophilic applications).

There are a number of technologies that currently produce patterned thin films with topologies ranging from several hundred nanometers to microns, including rolling mask lithography (developed by Rolith, Inc. of Pleasanton, Calif., USA), Nanoimprint Lithography (Molecular Imprints of Austin, Tex., USA and Obducat of Lund, Sweden), Holographic Lithography (TelAztec LLC of Burlington, Mass., USA), and Liquid Deposition ("Sharkskin coater" at Fraunhofer Institute in Munich, Germany). All of these methods use master-based methods to create a structure in a photoresist film that is subsequently used to either dynamically create structure in glass, or in thin polymer films that can be embossed and cured using UV light. None of these techniques are able to create arbitrarily varying patterns in a large area format or in a dynamic and digital manner.

Electrohydrodynamic (EHD) patterning is a recently developed technology that involves electrically transferring the micro- or nano-structures formed on a template onto a thin polymer film by shaping the surface of the liquid polymer film through a balance of applied forces on the liquid and the surface tension of the liquid. A surface instability can be driven by van der Waals and thermal forces, but is typically dominated by external forces, if those are present. All external (e.g., electrical or thermal) forces that cause a pressure gradient across the interface can cause this surface instability. The present invention focuses on EHD patterning techniques applied to polymer thin films having a height/thickness that is much less than the length-scale of the instability, so the kinetics of the polymer thin film are completely described by lubrication theory, and the emerging pattern is driven by the fastest growing capillary wave mode. The time scale for generating such polymer thin film EHD patterning is dependent on the liquid polymer's dielectric constant, viscosity, height/thickness and surface tension, the applied voltage (electric field), and the distance between the electrodes or charges used to generate the electric field, and the length scale of the emerging pattern is dependent on the surface tension, and the applied voltage and electric field inside the polymer film. These patterns can either occur at a length scale that is intrinsic to the film properties if the electric field is constant or be forced into specific structures if the electric field is spatially varied. The height of replication for EHD patterning has been limited at the nano-scale in previously proposed techniques because the electric field is sensitive to the spacer height of the template. In addition, conventional EHD patterning techniques are not commercially viable because they are unable to produce commercially useful quantities of film.

SUMMARY OF THE INVENTION

The present invention is directed to systems that implement improved Electrohydrodynamic (EHD) thin film patterning techniques and provide viable and economical manufacturing techniques to continuously producing micro-scale patterned structures that either integrally connected to a thin polymer film or are separated from each other. The systems utilize two curved conveyors (e.g., two rollers or two belts) having opposing surfaces that are spaced apart by a relatively large distances on opposite sides of a gap (or nip) region. A liquid thin film containing a polymer, a polymer precursor, or another suitable material, is coated or otherwise disposed onto one conveyor surface (e.g., the "lower" roller or belt) by a suitable coating mechanism such that it is subsequently conveyed into the gap region, where the minimum gap distance between the two conveyor surfaces is set such a small gap is provided between the upper film surface and the opposing conveyor surface. As it passes through the gap region, the liquid thin film is subjected to an electric field generated between the two conveyors, with the electric field strength and liquid thin film characteristics (e.g., viscosity and dielectric constant) being set such that the liquid thin film undergoes EHD patterning (i.e., portions of the liquid polymer are pulled toward the upper conveyor, thereby forming patterned micro-scale liquid polymer features that extend from the lower conveyor into the small gap that is filled with air or another fluid). An appropriate curing mechanism (e.g., a UV laser or thermal treatment) is utilized to cross-link (cure) the polymer thin film while undergoing EHD patterning (e.g., inside the gap region or immediately outside the gap region), whereby the liquid micro-scale polymer features are hardened (solidified) to form micro-scale patterned structures having substantially the same pattern shape that was generated in the liquid polymer by the electric field. The solid micro-scale patterned structures and any adjoining polymer thin film material are then removed from the lower conveyor. The present invention thus provides a low-cost and efficient system for continuously producing digital micro-scale polymer structures that can be utilized in a wide variety of commercial applications.

In accordance with a specific embodiment, the thin polymer film contains nanostructures (e.g., nanowires or nanotubes) that become vertically oriented within the micro-scale structures. Specifically, the nanostructures have initial (e.g., random) orientations during thin film formation, but become aligned within the micro-scale patterned structure in a substantially perpendicular orientation relative to the underlying conveyor surface in response to the applied electric field and resulting hydrodynamic forces associated with EHD patterning formation of micro-scale features. This attribute makes the present invention highly valuable for the large scale production of certain devices that contain specialized nanostructures (e.g., carbon nanotubes for the production of flexible electronics interconnects or sensor arrays.

According to an alternative embodiment of the present invention, discrete (separate) micro-scale patterned structures are produced that can be used for example, in creating micron sized particles for increased specificity in the delivery of drugs. The process involves forming a polymer thin film so that the thin film is entirely formed into features and breaks up into discrete liquid polymer "islands" as the applied electric field causes vertical growth of the micro-scale features (i.e., if insufficient liquid polymer surrounds the pillar-shaped micro-scale features, then the features become separated from each other). Subsequent curing "freezes" (solidifies) the discrete features to form a plurality of said solid micro-scale patterned structures disposed in a spaced-apart arrangement on the lower conveyor surface. The micro-scale patterned structures are then removed from the conveyor surface using a separating mechanism so that they can be incorporated into a target material.

In a practical embodiment, the upper and lower conveyors are implemented by parallel upper and lower cylindrical rollers, which are positioned by a nip (gap) system to define a precise nip distance. A UV cured polymer thin film is applied using a slot coater onto the lower roller, and curing is performed by way of UV laser light after micro-scale features are established by EHD patterning in the nip region. This roll-to-roll production system allows for high production output using existing slot coating systems and precision rollers, which minimizes manufacturing costs.

According to another practical embodiment, the two conveyors are implemented by belts positioned to define an elongated gap region between opposing horizontally disposed belt sections. Thermosetting or UV curable polymer are applied upstream of the gap region, and curing is performed by way of heating blocks or UV light transmitted through transparent belt material. In a specific embodiment, precise belt positioning is achieved using a tongue-and-groove type arrangement in which T-shaped ribs extend below each belt and are slidably received in corresponding grooves formed in a belt support structure. This belt-to-belt production system allows for longer pattern set-up periods and higher production output rates than the roll-to-roll approach.

According to another embodiment, in order to achieve the most flexibility in creating and controlling patterns, the present invention utilizes a dynamic charge generation device that facilitate digital control over the patterning process. In accordance with one specific embodiment, the dynamic charge generation device includes an array of segmented electrodes disposed on the continuous-surface moving electrode structure (e.g., an upper roller or belt), where each electrode is individually addressable (i.e., each segmented electrode is individually accessed by associated addressing lines). In other embodiments, charge patterns are either directly deposited or created through a photo-electric process on an insulated or dielectric surface of the moving electrode structure (e.g., by way of a scorotron), which provides the benefits of reducing the sensitivity of the EHD pattern on the electrode distance, enabling spatial modulation of the thin film patterns, and enabling temporal variations of the thin film patterns for continuous EHD patterning approaches. These digital patterning schemes allow the creation of coatings with arbitrary interactions with various wavelengths of EM radiation across an object, or surfaces with spatially varying wettability properties that act as passive pumps.

BRIEF DESCRIPTION OF THE DRAWINGS

These and other features, aspects and advantages of the present invention will become better understood with regard to the following description, appended claims, and accompanying drawings, where:

FIGS. 4(A), 4(B), 4(C), 4(D) and 4(E) are enlarged cross-sectional side views showing the formation of discrete micro-scale patterned features according to another specific embodiment of the present invention;

DETAILED DESCRIPTION OF THE DRAWINGS

The present invention relates to an improvement in systems for producing micro-scale patterned structures for a variety of commercial purposes. The following description is presented to enable one of ordinary skill in the art to make and use the invention as provided in the context of a particular application and its requirements. As used herein, directional terms such as "upper", "lower", "upstream" and "downstream", are intended to provide relative positions for purposes of description, and are not intended to designate an absolute frame of reference. In addition, the phrase "integrally connected" is used herein to describe the connective relationship between two portions of a single structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The invention is described below with reference to exemplary systems configured to produce EHD patterning conditions. Those skilled in the art will recognize that the parameters mentioned below are associated with specific experimental observations, and therefore are not intended to be limiting.

Figure 1:
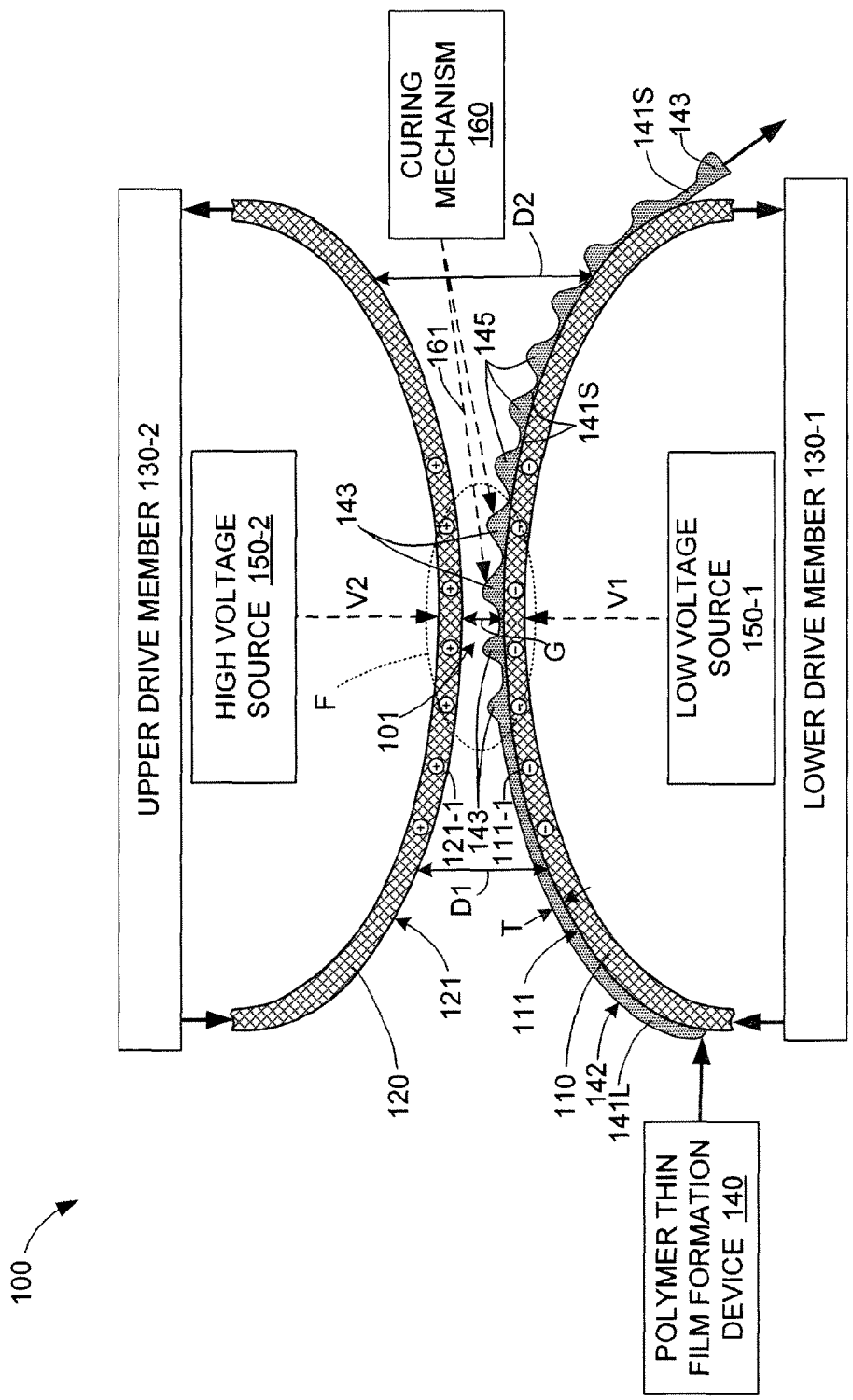
FIG. 1 is a cross-sectional side perspective view depicting a system according to a simplified embodiment of the present invention.

FIG. 1 depicts a system 100 for continuously producing digital micro-scale patterned (polymer) features on a thin film according to a simplified exemplary embodiment of the present invention. System 100 generally includes a lower (first) conveyor 110, an upper (second) conveyor 120, associated conveyor drive mechanisms 130-1 and 130-2, a thin film formation device 140, an electric field generator (indicated by low voltage source 150-1 and high voltage source 150-2), and an optional curing mechanism 160.

Conveyors 110 and 120 are implemented by any conveying devices (e.g., such as rollers or belts) that provide a curved surface capable of translating (moving) a liquid polymer thin film through a narrow gap region. Specifically, lower conveyor 110 has a lower (first) conveyor surface 111 that is supported and constrained to move along a corresponding first curved (e.g., circular or oblong) path, and second conveyor 120 has an upper (second) conveyor surface 121 that is supported and constrained to move along a corresponding second curved path. The curved paths associated with conveyors 110 and 120 are arranged such that conveyor surfaces 111 and 121 are separated by minimum distance G at a gap region 101, are separated by a relatively large first distance D1 at a "upstream" location from gap region 101, and a relatively large second distance D2 at an "downstream" location from gap region 101, where distances D1 and D2 are much larger than minimum gap distance G. For purposes that are described below, both lower conveyor 110 and upper conveyor 120 comprise an electrically conductive or dielectric material that maintains a potential across gap region 101 during operation. In one embodiment, lower conveyor 110 includes an electrically conductive metal or polymer, or is optionally coated with an electrically conductive and transparent material such as Indium-Tin Oxide (ITO). Upper roller 120 also includes an electrode pattern (described below), or includes an electrically conductive metal or polymer.

According to an aspect of the invention, lower conveyor 110 and upper conveyor 120 are respectively driven by lower drive member 130-1 and upper drive member 130-2 (e.g., motors and/or belts) such that surfaces 111 and 121 move at matching speeds through gap region 101. Specifically, surfaces 111 and 121 are moved along their respective paths such that each (first) surface region 111-1 of lower surface 111 passes through gap region 101 substantially simultaneously with a corresponding (second) surface region 121-1 of upper surface 121.

Referring to the left side of FIG. 1, thin film formation device 140 is a coating device or other mechanism suitable for disposing a curable liquid polymer thin film 141L on lower conveyor surface 111 at a point that is upstream from gap region 101, whereby thin film 141L is subsequently conveyed into gap region 101 by normal movement of lower conveyor 110. For example, device 140 deposits a thin film (first) portion 141-1 of a liquid polymer (e.g., polystyrene, polyvinyl alcohol (PVA), Polyvinylpyrrolidone (PVP), Polyethylene glycol (PEG) or OrmoStamp® UV cure polymer) on surface region 111-1 of lower conveyor surface 111, and subsequent movement of lower conveyor surface 111 causes portion 141-1 to move into gap region 101. In one embodiment, thin film formation device 140 is implemented by a slot coater that reliably creates thin film 141L having a thickness (height) T (measured from conveyor surface 111 to an upper surface 142 of thin film 141) in the range of 1 to 100 microns). In other embodiments, other coating devices (e.g., a slot die coating system, a slide coating system, or a curtain coating system) that reliable create thin films having a few microns thickness are used.

According to another aspect of the present invention, low voltage source 150-1 and high voltage source 150-2 generate an electric field F between lower conveyor 110 and upper conveyor 120, for example, by respectively applying a low voltage V1 and high voltage V2 (e.g., 0V and 100V, respectively) to the electrically conductive material disposed on conveyors 110 and 120. The strength of electric field F is determined by the relative distance between the relatively low and relatively high charges generated by voltages V1 and V2, which are indicated by "+" and "−" in FIG. 1 for descriptive purposes only (e.g., one of the charges may be 0V or the polarity of the charges may be reversed). That is, due to the curved path followed by conveyor surfaces 111 and 121, electric field F is highest (strongest) in gap region 101 (i.e., due to minimal gap distance G), and decreases (weakens) on either side of gap region 101 in accordance with the associated spacing distance between surfaces 111 and 121. In accordance with an aspect of the present invention, voltages V1 and V2 are selected such that electric field F is sufficient to cause polymer liquid thin film 141L to undergo EHD patterning (deformation) as polymer liquid thin film 141 passes into and through gap region 101, thereby forming patterned liquid polymer features 143 in liquid polymer thin film 141L. Specifically, due to EHD patterning, patterned liquid polymer features 143 in the form of raised ridges or pillars are formed by liquid polymer drawn from surrounding portions of thin film portion 141, whereby each patterned liquid polymer feature 143 extends upward from conveyor surface 111 into gap region 101 (i.e., toward upper conveyor 120). By controlling the strength of the electric field F and by utilizing suitable polymer characteristics (e.g., viscosity), patterned liquid polymer features 143 exhibit a micro-scale patterned shape (i.e., the width and height of each patterned liquid polymer feature 143 is on the order of 1 to 100 microns) in gap region 101.

According to another aspect of the present invention, the EHD patterned liquid polymer features 143 and any surrounding polymer material are cured before the thin film polymer material passes out of electric field F. Referring to the right side of FIG. 1, curing mechanism 160 acts to solidify each patterned liquid polymer feature 143 (i.e., when it is located inside gap region 101, or immediately after it exits gap region 101 but is still subjected to electric field F) and the surrounding polymer material, thereby forming solid micro-scale patterned structures 145 extending from solidified polymer thin film 141S, where each micro-scale patterned structure 145 has substantially the same micro-scale patterned shape as that of its precursor liquid polymer feature 143. The specific curing mechanism 160 utilized in each instance is determined by the type of polymer material forming thin film 141L (e.g., if a UV curable polymer is used, then curing mechanism 160 is implemented by a UV curing system, e.g., that directs a UV laser beam 161 onto portions of thin film 141L disposed in gap region 101). In other embodiments, depending on the type of polymer used, curing mechanism 160 is implemented by, for example, a visible light curing system or a focused thermal curing system.

Referring to the lower right portion of FIG. 1, subsequent to the curing process (i.e., downstream from gap region 101), solidified polymer thin film 141S is removed from lower conveyor 110 for further processing. Note that micro-scale patterned structures 145 remain spaced apart and extend upward from solidified polymer thin film 141S.

Figure 2:
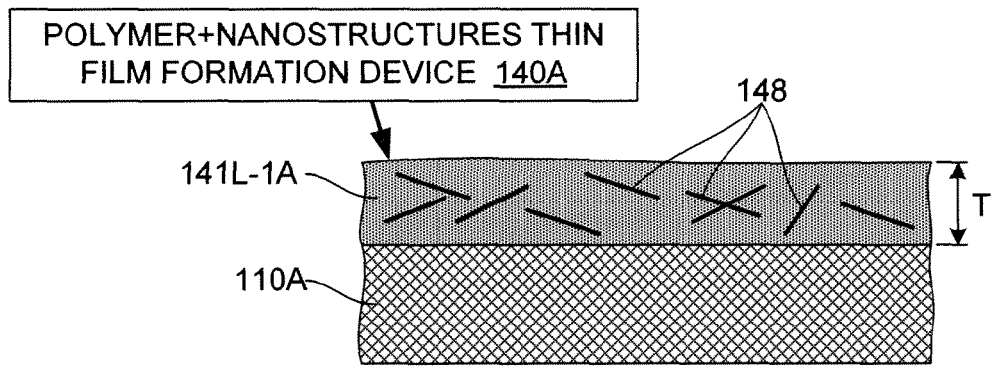
FIG. 2 is an enlarged cross-sectional side view showing a polymer thin film containing nanostructures.
Figure 3:
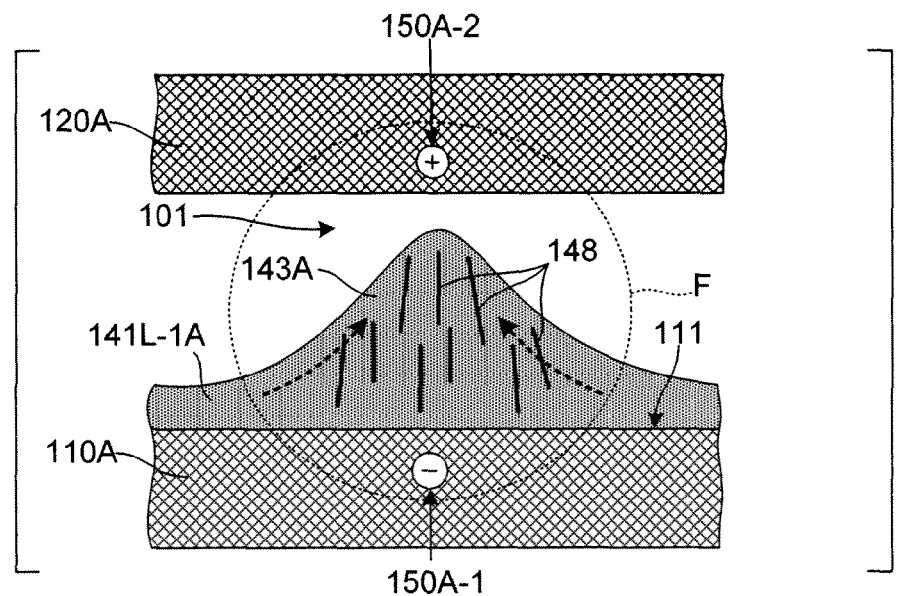
FIG. 3 is an enlarged cross-sectional side view showing the formation of micro-scale patterned features containing the nanostructures of FIG. 2 according to a specific embodiment of the present invention.

FIGS. 2 and 3 illustrate an unique attribute of the modified EHD patterning approach of the present invention in which "loaded" polymer thin films contain nanostructures that are inherently aligned during the formation of micro-scale polymer structures, thereby facilitating the production of a wide variety of highly valuable commercial applications.

FIG. 2 is a partial cross-sectional view showing a liquid polymer thin film portion 141L-1A including nanostructures 148 (e.g., carbon nanotubes or GaAs nanowires). In this case, a polymer/nanostructure thin film formation device 140A (e.g., one of coating systems mentioned above that is optimized to deposit the modified polymer/nanostructure material) forms liquid polymer thin film portion 141L-1A having thickness T on lower conveyor 110 utilizing the structures similar to those described above with reference to FIG. 1. Note that nanostructures 148 are dispersed with initial (e.g., random or non-random) orientations within liquid polymer thin film portion 141L-1A at deposition.

FIG. 3 shows liquid polymer thin film portion 141L-1A when it is disposed in gap region 101 between lower conveyor 110 and upper conveyor 120 in a manner similar to that described above with reference to FIG. 1. As described above, electric field F generated by voltage sources 150A-1 and 150A-2 causes EHD patterning deformation, whereby liquid polymer material flows inward and upward (as indicated by the dashed-line arrows) to form a patterned liquid polymer feature 143 that extends from liquid polymer thin film portion 141L-1A toward upper conveyor 120. In addition, when nanostructures 148 are reactive to an electric field (e.g., carbon nanotubes), nanostructures 148 align in electrical field F and couple to the hydrodynamic forces that result from the pattern formation, producing a generally vertical orientation (i.e., generally perpendicular to surface 111 of lower conveyor 110).

To this point the present invention has been described with reference to the fabrication of polymer thin films in which spacing between the micro-scale patterned structures is fixed by a thin polymer material to which the micro-scale patterned structures are integrally connected, for example, as shown in FIG. 1. Although such integral polymer thin films are believed to have many commercial applications such as those mentioned above, individual (separated) micro-scale patterned structures are useful in other commercial applications (e.g., medicine).

FIGS. 4(A) to 4(E) are simplified cross-sectional views illustrating system 100B according to an alternative embodiment of the present invention that produces separated (discrete) micro-scale structures for the creation of particles with increased specificity in the delivery of drugs.

FIG. 4(A) depicts a polymer thin film portion 141B1(t0) at an initial time period (t0) on surface 111B of lower conveyor 110B. As in the previous embodiments, polymer thin film portion 141B1(t0) is formed by a slot coater or other thin film formation device 140B (not shown) while surface 111B is separated from surface 121B of upper conveyor 120B by relatively large distance D1. In the present embodiment, to cause the polymer thin film to break up into discrete islands as described below, the polymer material forming polymer thin film portion 141B1(t0) has a relatively low viscosity and/or a thickness T1 of polymer thin film portion 141B1(t0) is intentionally lower than that used in the embodiments described above.

FIG. 4(B) illustrates polymer thin film portion 141B1(t1) at a time period (t1) subsequent to time t0 after being moved by lower conveyor 110B into a position immediately upstream from the gap region, where surface 111B is separated from surface 121B by a relatively small distance D11. At this point the applied electric field F(t1) generated by supplies 150B-1 and 150B-2 begins to cause EHD patterning of polymer thin film portion 141B1(t1), whereby the inward and upward flow of liquid polymer generates a liquid micro-scale patterned feature 143B(t1). Note that at time t1, due to its small size, sufficient liquid polymer material surrounds patterned feature 143B(t1) to maintain a continuous (although very thin) web-like portion 141B11.

FIG. 4(C) illustrates polymer thin film portion 141B1(t2) at a time period (t2) subsequent to time t1, when patterned feature 143B1(t2) is disposed in gap region 101B (i.e., where minimal gap distance G separates conveyors 110B and 120B). Due to the low viscosity and/or thin film thickness of the polymer thin film, the strength of electric field F(t2) causes patterned liquid polymer features 143B(t2) to separate from adjacent polymer features (not shown) on first surface 111B. That is, because no additional surrounding fluid is available to supply the vertical growth of patterned feature 143B1(t2), web-like portion 141B11 breaks away from adjacent features, whereby the liquid forming patterned feature 143B1(t2) comprises a discrete "island" of liquid polymer. Specifically, the spacing and thickness of the polymer film are controlled such that the volume of liquid polymer drawn into each patterned feature (discrete liquid island) 143B1(t2) as it grows in the vertical (Z) direction (i.e., perpendicular to surface 111B) is equal to the volume of fluid in the negative space of the pattern, the EHD patterning process creates small particles of the same size scale as the patterns.

FIG. 4(D) illustrates polymer thin film portion 141B1(t3) at a time period (t3) immediately subsequent to time t2, when patterned feature 143B1(t3) is disposed immediately downstream from the gap region (i.e., where conveyors 110B and 120B are separated by a distance D21 that is substantially equal to or slightly larger than the minimum gap distance). At this point patterned feature 143B1(t3) a curing energy 161B (e.g., UV laser light) "freezes" (solidifies) discrete feature 143B1(t3) to form a solid micro-scale patterned particle (structure) 145B. Note that this curing process is performed on every discrete feature as it passes through the gap region, thereby generating multiple solid micro-scale patterned particles disposed in a spaced-apart arrangement on conveyor surface 111S.

FIG. 4(E) illustrates micro-scale patterned particle 145B subsequent to time period t3. According to an embodiment of the present invention, a separator device 170B (e.g., a knife edge) acts to separate micro-scale patterned structure 145B from conveyor surface 111B.

Figure 5:
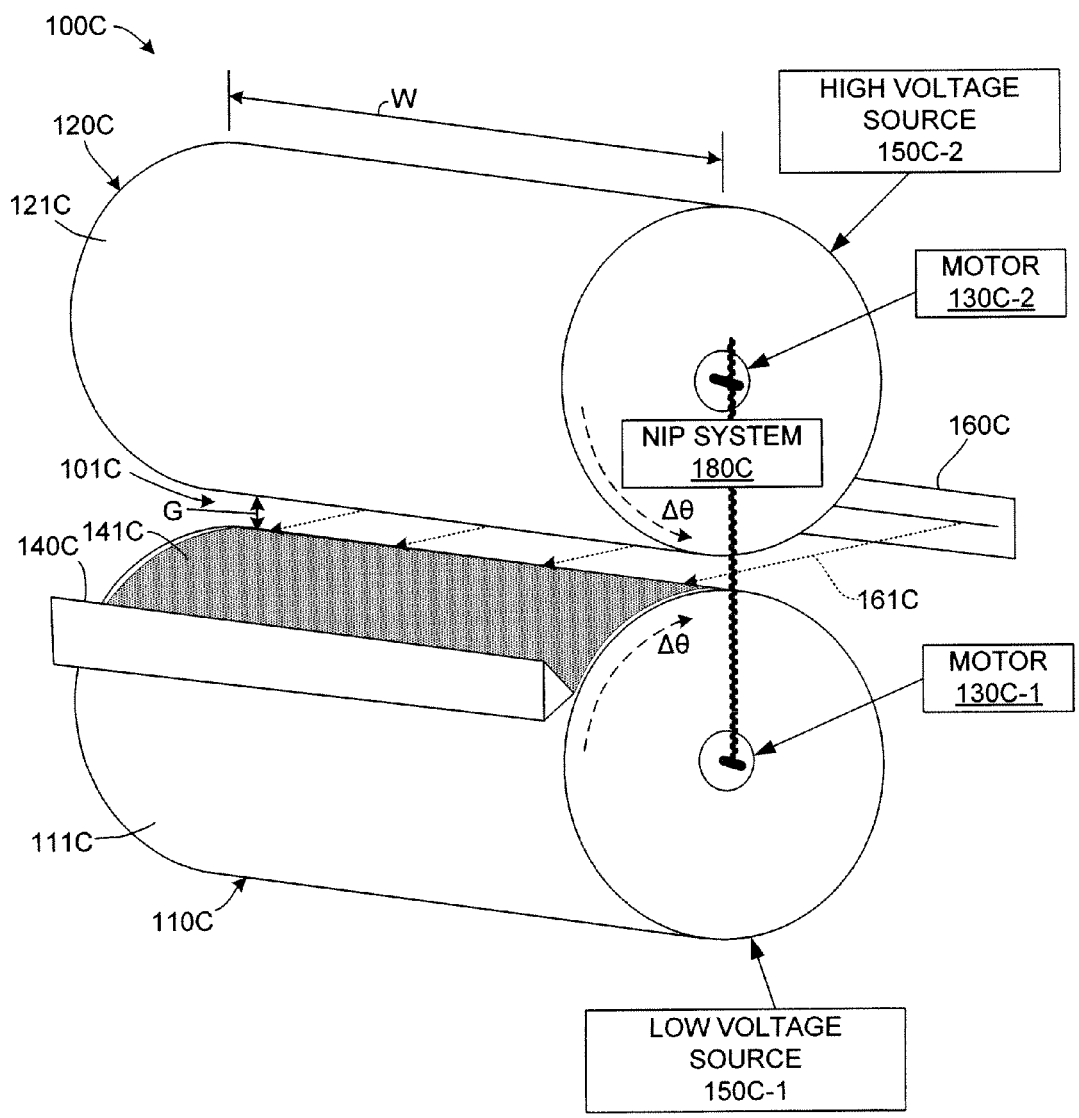
FIG. 5 is a perspective side view showing a simplified roll-to-roll-type system for producing micro-scale patterned structures according to a practical embodiment of the present invention.

FIG. 5 is a perspective view showing a system 100C according to a practical specific embodiment of the present invention in which the generalized conveyors mentioned above are implemented by parallel lower and upper rollers (conveyors) 110C and 120C, the generalized thin film formation device is implemented by a slot coater 140C, and the generalized curing device is implemented by a ultraviolet (UV) light source 160C, where these specific devices are controlled to perform a production method consistent with the generalized methods described above.

Referring to the lower portion of FIG. 5, lower roller 110C is operably coupled to low voltage source 150C-1 such that it acts as the ground in the electric field circuit. To generate the electric field, the outer peripheral portions of lower roller 110C are made up of either an electrically conductive metal or an electrically conductive polymer, or outer surface 111C is optionally coated with an electrically conductive and/or transparent material such as ITO.

Top roller 120C is operably coupled to high voltage source 150C-2 that supplies one or more high voltage signals to generate the applied electric field circuit. In one embodiment, outer surface 121C of top roller 120C includes a continuous conductive layer that is electrically active across the entirety of roller surface 121C. In other embodiments (discussed in additional detail below), top roller 120C includes either an electrode pattern or a dielectric material to which a charge pattern is applied.

Lower roller 110C and upper roller 120C are driven by one or more motors 130C-1 and 130C-2 using techniques known in the art such that each region of surface 111C through nip-type gap region 101C substantially simultaneously with a corresponding region of surface 121C (i.e., rollers 110C and 120C are driven at matching speeds). Lower roller 110C and upper roller 120C are maintained by a support structure (also not shown) such that they remain separated by a fixed minimum distance G at a nip (gap) region 101C. A conventional high precision nip system 180C, which is operably connected between the axis of rollers 110C and 120C to facilitate adjustment of minimum distance G using known techniques, serves to guarantees high roller distance dimensional control.

Slot coater 140C coats (deposits) liquid polymer thin film 141C either directly onto cylinder roller surface 111C of lower roller 110C, or onto a support web (not shown) that is disposed over surface 111C. Slot coaters capable of performing this function are well known in the art. When polymer film 141C enters nip region 101C, it either replicates the pattern of electrodes disposed on upper roller 120C in the manner described below, or sets up a pattern based on the natural instability of the polymer system as described above.

To facilitate curing near the nip (gap) region 101C between rollers 110C and 120C, UV curable polymers are utilized because of their fast fixing time, and "fixing" mechanism is implemented by a system 160C (e.g., one of an Ultra Violet (UV) curing system, an visible light curing system, and a focused thermal curing system) that directs beam 161C onto a location adjacent to nip-type gap region 101C. Specifically, after passing through nip region 101C, beam 161C is applied such that the polymer is cross-linked and hardens into the solid micro-scale pattern shapes enforced on the liquid polymer by the applied electric field. UV laser systems capable of performing this curing function are well known in the art. In an alternative embodiment the curing system is disposed inside one of rollers 110C and 120C, and is directed through transparent roller material into gap region 101C. Solidified polymer film (not shown) is then removed from lower roller 110C and moved downstream for any additional steps that might be required.

The production output of system 100C is limited by two factors: the width W of rollers 110C and 120C, and the rotational speed Δθ of rollers 110C and 120C. Roller width W is limited by the physical ability to both manufacture and install rollers 110C and 120C within the tolerances required. These tolerances are similar to those in typical slot coating systems, which can reasonably be expected to maintain a 0.5 micron tolerance over 3.5 meters. For one such realization of 8 micron features with a 2 micron tolerance, this leads to a maximum output of 1.3 m/s with fast UV cure times. The width can be increased and the sensitivity of the film pattern to machine tolerances can be adjusted for by varying the applied voltage through a number of electrode addressing schemes that are explained in further detail below.

Figure 6:
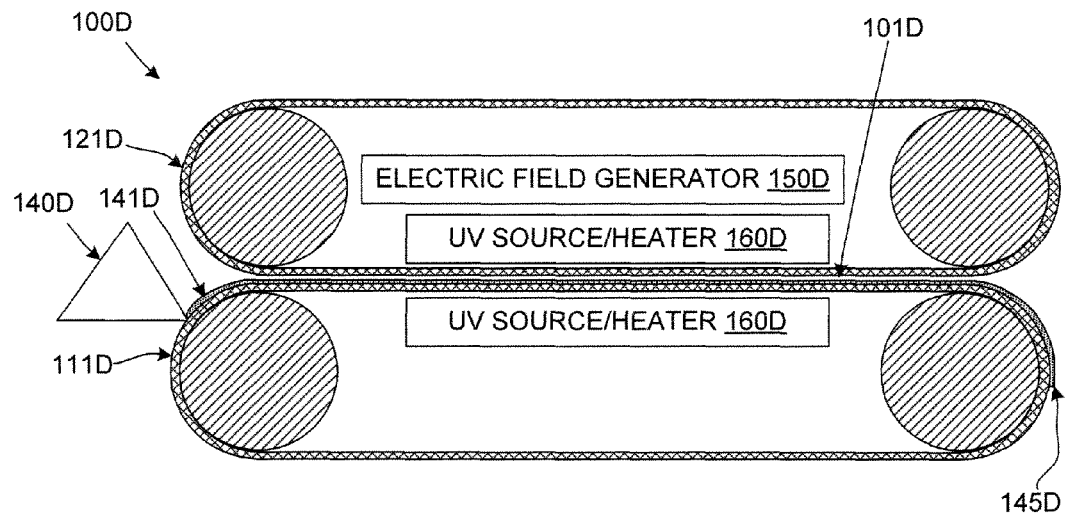
FIG. 6 is a cross-sectional side view showing a simplified belt-to-belt-type system for producing micro-scale patterned structures according to another practical embodiment of the present invention.

FIG. 6 is a simplified cross-sectional side view showing a system 100D according to another practical embodiment of the present invention. System 100D is characterized by a belt-to-belt arrangement formed by a lower belt-like conveyor 110D and an upper belt-like conveyor 120D that are positioned to define an elongated gap region 101D between opposing planar regions of lower belt surface 111D and upper belt surface 121D. A thin film deposition device (e.g., a slot coater) 140D is disposed to form a liquid polymer thin film 141O on lower belt surface 111D prior to entering gap region 101D, and voltage sources (not shown) are connected as described above to conductive material formed on the belts to generate the desired electric field inside elongated gap region 101D.

The belt-to-belt arrangement of system 100D is similar to the roll-to-roll arrangement of 100C, but instead of a small nip-type gap area of the roll-to-roll arrangement, system 100D provides a large gap region that allows more time for the formation of the micro-scale pattern features. This arrangement facilitates the use of thermosetting polymers by facilitating thermal curing (e.g., by way of thermal curing systems (heater blocks) 160D disposed along the inside surface of the belt material adjacent to elongated gap region 101D). To facilitate thermal curing, the belts are formed, for example, using a thermally conductive material, or a transparent material for admitting IR light into elongated gap region 101D.

In order to maintain the tight tolerances required for the belt-to-belt process shown in FIG. 6, belt-like conveyors 110D and 120D must be held close by way of alignment blocks. This can either be achieved with significant amounts of tension or interlocking parts that slide in and out of the block using the arrangement indicated in FIG. 7.

Figure 7:
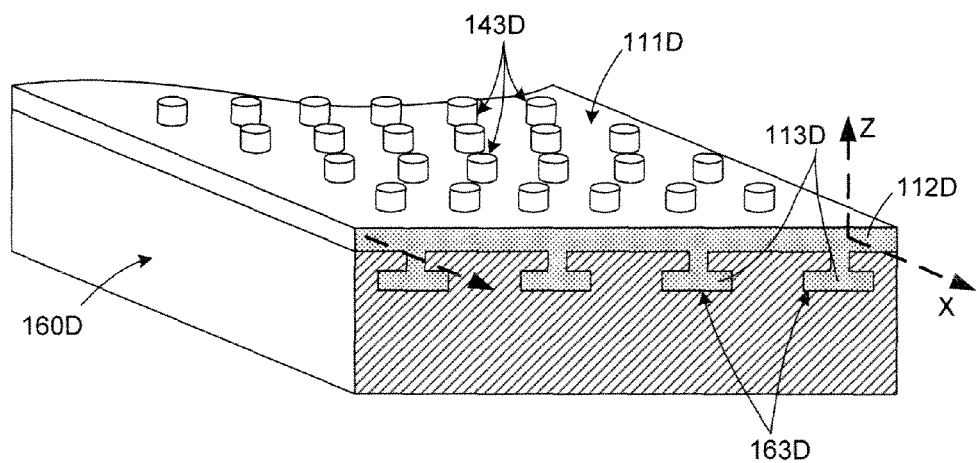
FIG. 7 is a cross-sectional side view showing a portion of the system of FIG. 6.

FIG. 7 is a perspective cross-sectional view showing an interlocking arrangement according to a specific embodiment by which lower belt-like conveyor 110D is maintained in a precise planar orientation relative to an upper surface of underlying heater block (or other support structure) 160D. As indicated, lower belt-like conveyor 110D includes a carrier belt portion 112D that slides over a planar upper surface 161D of heater block 160D such that patterned liquid features 143D form on conveyor surface 111D according to one of the processes described above. To maintain precise Z-axis positioning relative to planar upper surface 161D across the entire width of carrier belt portion 112D, heater block 160D is constructed to define elongated T-shaped grooves 163D that extend in the moving direction X of lower belt-like conveyor 110D, and lower belt-like conveyor 110D includes T-shaped ribs 113D that extend below upper belt portion 112D and are slidably received in corresponding grooves 163D. Upper belt-like conveyor 120D (FIG. 6) is constructed with a similar arrangement, thereby providing a sliding tongue-and-groove type arrangement that constrains the belts in the vertical direction and allows for tight tolerances to be achieved.

Belt-to-belt system 100D facilitates higher production output speeds (i.e., linear belt speeds). The belt tolerances are largely dictated by the same tolerance limitations in the design of roll coating equipment. With precision machining it would be possible, in one possible realization to achieve a 0.5 micron tolerance over a 3.5 meter length. To create 8 micron features with a 2 micron tolerance over a 7 meter by 7 meter area, the total linear speed of the belts in this realization are limited to about 14 m/s. This realization is thus capable of much higher and industrially relevant throughput.

Due to the longer processing time provided by elongated gap region 101D, belt-to-belt system 100D facilitates operations that do not require a curing device (i.e., system 100D). In this case, polymer 141D is heated and applied in a melted state onto surface 111D upstream of gap region 101D. The polymer temperature is high enough to maintain the melted state as the polymer is patterned by the applied electric field in the manner described above. Once the pattern has been established, the polymer is allowed to cool below the polymer's melting point temperature to form solid micro-scale patterned structures 145D having one of the forms described above.

According to a preferred approach, in order to achieve the most flexibility in creating and controlling the micro-scale patterns, the various systems described above (including both belt and roller embodiments) are modified to include digital patterning control, which is implemented using a dynamic charge generation mechanism that facilitates EHD patterning (i.e., electric field generation) by producing a dynamic (variable) charge pattern on at least one of the conveyor surfaces, whereby the charge pattern defining the electric field is dynamically alterable to compensate for system variances. As set forth in the following exemplary embodiments, such dynamic charge generation is achieved using either segmented electrodes or a charge patterning scheme.

FIG. 8(A) is a simplified diagram depicting a system 100E includes a lower (first) conveyor 110E and an upper (second) conveyor 120E that are constructed and arranged to convey a polymer thin film 141E through a gap region 101E, where thin film 141E is generated on lower conveyor surface 111E by a suitable device 150E and patterned by an electric field F to form features 143E that are subsequently cured (e.g., by way of UV light 161E) to form micro-scale structures 145E in a manner similar to that described above.

System 100E is characterized in that at least one of conveyors 110E and 120E includes segmented electrodes that are digitally addressable by a dynamic voltage source (electric field generator) such that each individual electrode receives an associated charge (voltage) having a value determined, e.g., by experimental measurement performed prior to production operations. Specifically, upper conveyor 120E includes segmented upper electrodes 125E that are individually addressable by dynamic high voltage source (electric field generator) 150E-2 such that each individual upper electrode (e.g., electrodes 125E-1 to 125E-5) receives an associated (e.g., unique/different or common/same) voltage value. Alternatively (or in addition), lower conveyor 110E includes segmented lower electrodes 115E that are digitally addressable by dynamic low voltage source (electric field generator) 150E-2 such that each individual lower electrode (e.g., electrodes 115E-1 to 115E-5) receives an associated voltage value. Sources 150E-1 and 150E-2 are electronic circuits produced in accordance with known techniques to generate and deliver associated voltage values such that each segmented electrode (or each upper/lower electrode pair) produces an associated portion of electric field F having an associated field strength. For example, upper electrode 125E-1 (or the pair formed by upper electrode 125E-1 and lower electrode 115E-1) generate electric field portion F1 in the region between conveyor 110E and 120E. Similarly, electrodes 125E-2 to 125E-5 (or pairs 125E-2/115E-2, 125E-3/115E-3, 125E-4/115E-4 and 125E-5/115E-5) generate electric field portions F2 to F5, respectively.

Figure 8:
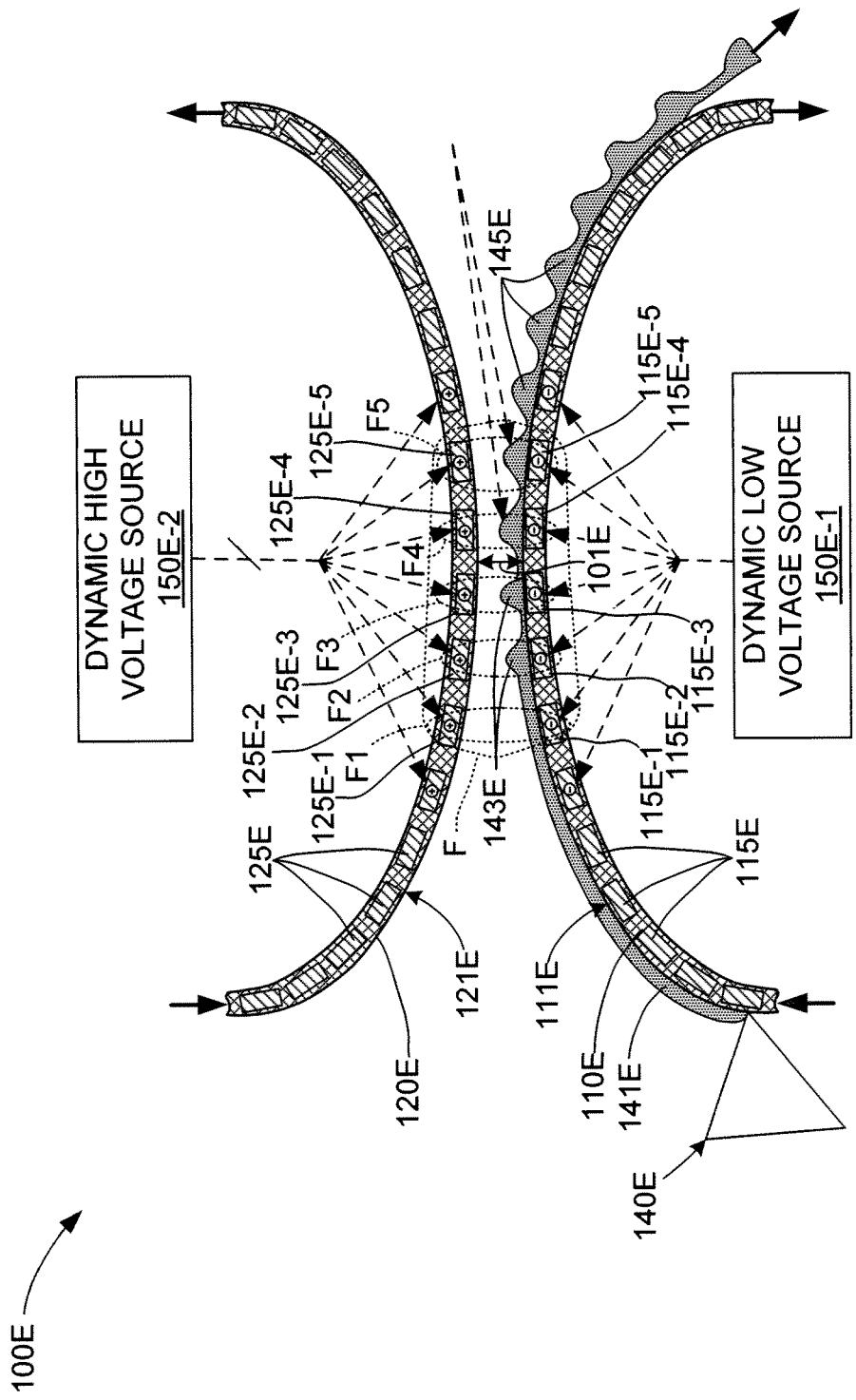
FIG. 8 is a cross-sectional side view showing a simplified system for producing micro-scale patterned structures using separated electrodes according to another embodiment of the present invention.
Figure 9:
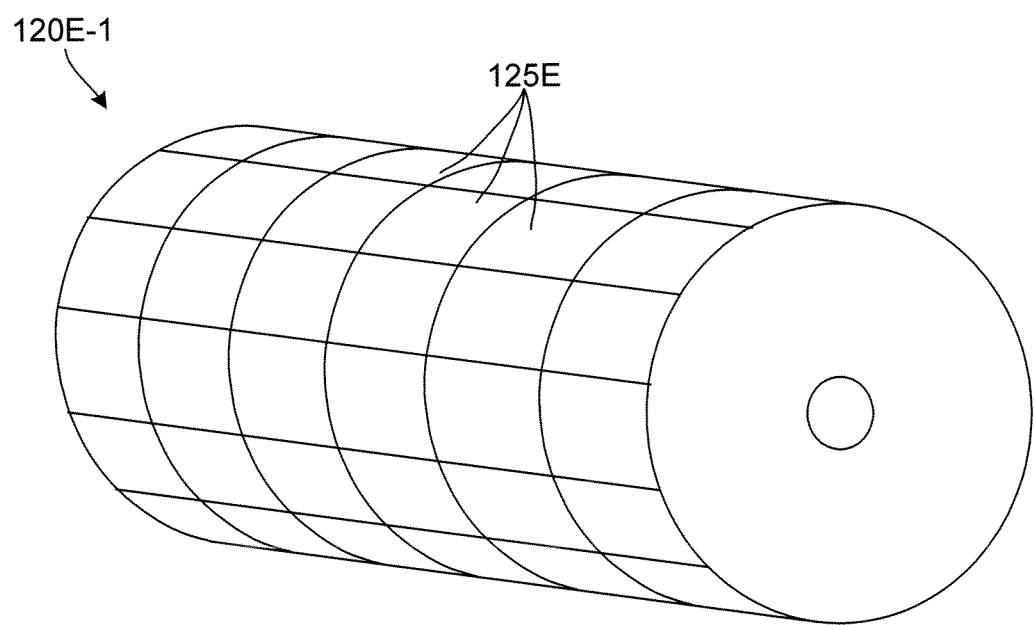
FIG. 9 is a simplified perspective view showing a portion of the system of FIG. 8.

FIG. 9 is a perspective view showing a roller-type upper conveyor 120E-1, which represents one type upper conveyor 120E used in system 100E (i.e., conveyor 120E may also be implemented using a belt-type conveyor). As indicated by conveyor 120E-1, segmented upper electrodes 125E are arranged both along the rotational (circumferential) direction (i.e., as indicated in FIG. 8), and are also arranged along the cylindrical axis. That is, although the description related to FIG. 8 refers to variable charge patterns occurring along the rotational direction of roller-type conveyor 120E-1, it is understood that variable charge patterns discussed herein vary along the circumferential axis direction as well. That is, all electrodes 125E of roller-type upper conveyor 120E-1 are independently addressable such that each electrode receives an associated charge value.

Referring again to FIG. 8, segmented electrodes 125E allow digital control over the electric field generated in gap region 1015 during EHD patterning by facilitating the transmission of predetermined unique (different) or identical voltage values to each electrode, thereby allowing electrical correction (if needed) for physical variances that inevitably arise in large systems requiring precise tolerances, such as system 100E. That is, differences in localized electric field values F1 to F5, which may be caused by electrode distance variations between neighboring electrodes 125E-1 to 125E-5 or between paired electrodes (e.g., electrodes 115E-1 and 125E-1) across gap region 101E, are correctable by transmitting a predetermined unique "high" voltage to each electrode 125E-1 to 125E-5. For example, each electrode 125E-1 to 125E-5 is individually addressed by dynamic high voltage source 150E-2 and receives an associated voltage whose value is set such that each electric field portion F1 to F5 has uniform field strength. Note that the electrodes 125E arranged in the cylindrical axis direction (i.e., as shown in FIG. 9) are also individually addressed by dynamic high voltage source 150E-2, and receive an associated voltage whose value is set such that each associated electric field portion also has a uniform field strength. Exemplary segmented electrodes with individual addressing schemes suitable for implementing electrodes 115E and 125E are disclosed in co-owned U.S. Pat. No. 7,163,611, entitled CONCENTRATION AND FOCUSING OF BIO-AGENTS AND MICRON-SIZED PARTICLES USING TRAVELING WAVE GRIDS, which is incorporated herein by reference in its entirety.

In alternative embodiments, at least some of segmented electrodes 125E have a modified (different) shape (e.g., line or point electrodes) that cover different parts of the "counter" surface depending on the patterns needed. Possible examples of line or point electrodes are disclosed in U.S. Pat. No. 7,163,611 (cited above). Other electrode shapes (e.g., hexagonal or circular) are also possible, e.g., for making custom-shaped micro-scale particles.

In alternative embodiments, the size and distances between electrodes is altered to produce the desired EHD pattern. For example, although FIG. 8 indicates that each electrode pair produces a single separate micro-scale structure 145E, in other embodiments each electrode may be sized to generate multiple features/structures. By controlling the shape of the electrode a competing length scale to the intrinsic $\lambda$max is introduced, which can either dominate the pattern formation dimension on the 2D plane, or define the area for the intrinsic pillar pattern.

In other alternative embodiments, the voltages (charges) transmitted to each segmented electrode is changed (i.e., increased or decreased) over time, allowing for either custom pattern growth and or compensation of fabrication variations across the patterning area. These voltages can be adjusted dynamically, to either achieve specific quality metrics in the film, or to adjust as processing conditions change leading to an extremely robust process.

Figure 10:
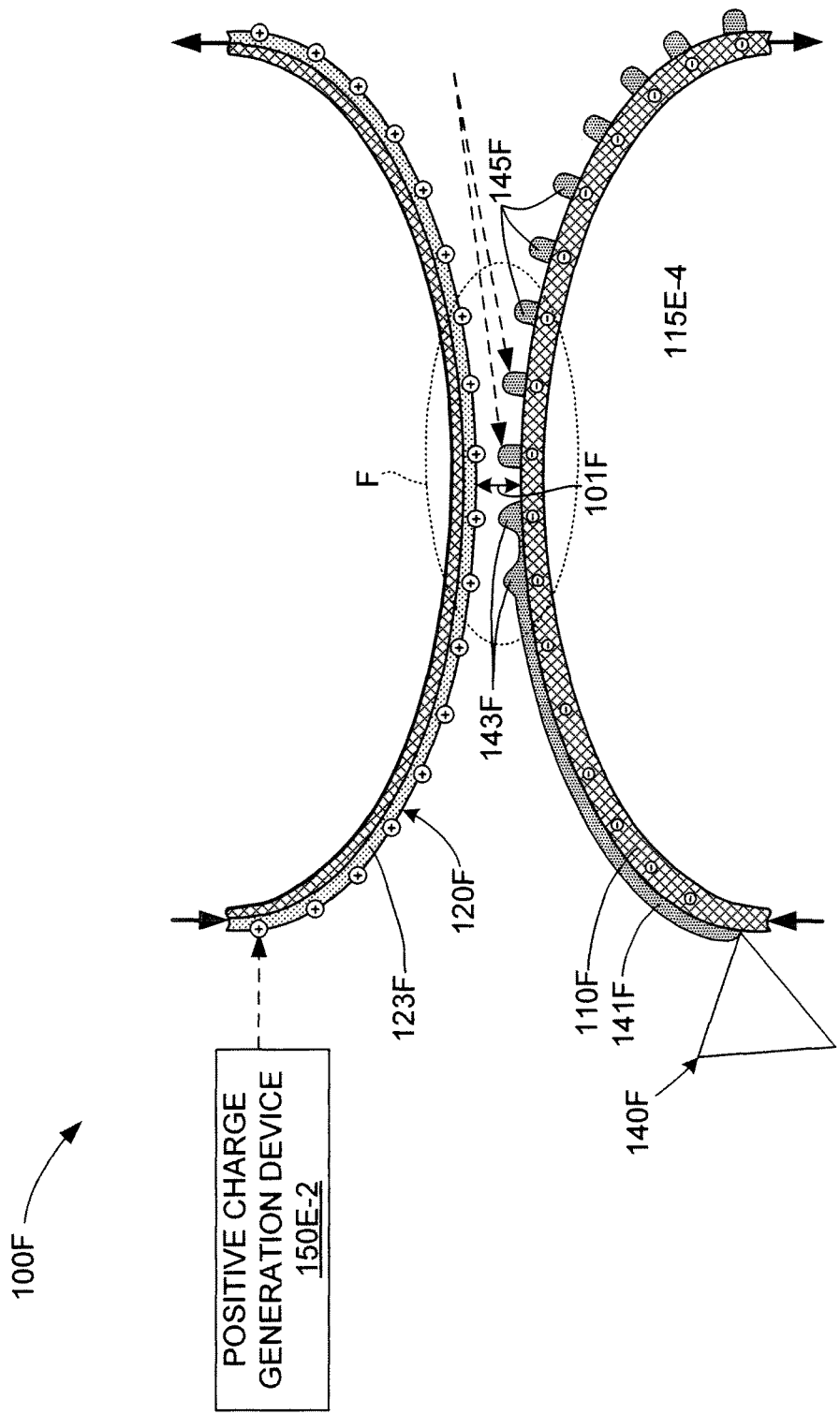
FIG. 10 is a cross-sectional side view showing a simplified system for producing micro-scale patterned structures using applied charge patterns electrodes according to another embodiment of the present invention.

FIG. 10 is a simplified diagram depicting another system 100F including a lower (first) conveyor 110F and an upper (second) conveyor 120F that are constructed and arranged to convey a polymer thin film 141F through a gap region 101F, where thin film 141F is deposited by device 140F and patterned by an electric field F to form features 143F that are subsequently cured to form micro-scale structures 145F in a manner similar to that described above. System 100F differs from the previous embodiment in that dynamic charge generation is achieved using well-defined charge patterns that are formed on an appropriate insulating or semiconducting material layer 123F disposed on surface 121F of upper conveyor 120F. In an exemplary embodiment first (e.g., positive) charges are selectively applied in a predetermined pattern on layer 123F by a first (e.g., positive) charge generating device 150F (e.g., a plasma generating device such as a scorotron) upstream of gap region 101F, whereby the first charges generate corresponding portions of electric field F in a manner similar to that described above with reference to the segmented electrode approach. In other embodiments, relatively high charges are applied to the electrodes on lower conveyor 110F, and relatively low charges are applied to the electrodes of upper conveyor 120F. In some embodiments, the charge patterns are achieved by either a masking process, or by a set of plasma generating devices of the required size. In other embodiments, a photo sensitive material, such as a photo receptor film similar to that used in a laser printer, is disposed on the upper conveyor, and the charge pattern is generated by light transmitted onto the photo sensitive material, where laser beam(s) are used to write a charge pattern on a photo receptor. The charge patterning approach provides an advantage in applications where different EHD patterns are needed in subsequent fabrication steps, or in continuous patterning systems (i.e. where each sheet or section of thin film has a different pattern). The charge patterning approach gives the biggest variability on the addressing electrodes, since the charge pattern can be changed easily from one step to the next, especially for the case of optical charge generation (similar to Xerography).

Although the present invention has been described with respect to certain specific embodiments, it will be clear to those skilled in the art that the inventive features of the present invention are applicable to other embodiments as well, all of which are intended to fall within the scope of the present invention. For example, although the various examples describe relatively high (e.g., positive) charges being applied to the upper conveyor and relatively low (e.g., negative) being applied to the lower conveyor, in other embodiments the associated electric field is generated by reversing the applied charges (i.e., with relatively high (e.g., positive) charges being applied to the lower conveyor and relatively low (e.g., negative) being applied to the upper conveyor).

The invention claimed is:

1. A system for producing a micro-scale patterned structure, the system comprising:
   a first conveyor having a first surface constrained to move along a first path;
   a second conveyor having a second surface constrained to move along a second path, the first and second paths being arranged such that a minimum distance defined between the first and second surfaces occurs in a gap region;
   means for moving the first and second conveyors at matching speeds such that a first surface region of the first surface passes through said gap region substantially simultaneously with a corresponding second surface region of said second surface;
   means for disposing a curable liquid thin film on the first surface region such that a first portion of said curable liquid thin film is disposed on the first surface region when the first surface region is located upstream from the gap region;
   means for generating an electric field between the first conveyor and the second conveyor such that said first portion of the liquid thin film disposed on said first surface region undergoes Electrohydrodynamic (EHD) patterning deformation during passage of said first surface region through the gap region such that the first portion forms a patterned liquid feature having a micro-scale patterned shape; and
   means for solidifying the patterned liquid feature to form said solid micro-scale patterned structure having said micro-scale patterned shape,
   wherein said means for disposing said curable liquid thin film comprises means for forming a liquid polymer thin film with nanostructures dispersed with initial orientations within said liquid polymer thin film, and
   wherein said means for generating an electric field comprises means for aligning the nanostructures in a substantially perpendicular orientation relative to the first surface within the micro-scale patterned structure.

2. The system of claim 1, wherein said means for disposing the curable liquid thin film on the first surface region comprises one of a slot coating system, a slot die coating system, a slide coating system and a curtain coating system.

3. The system of claim 1, wherein at least one of the first conveyor and the second conveyor comprise one of an electrically conductive material and a dielectric material.

4. The system of claim 3, wherein said means for generating said electric field comprises means for applying a first voltage to said one of an electrically conductive material and a dielectric material disposed on the first conveyor, and means for applying a second voltage to said one of an electrically conductive material and a dielectric material disposed on the second conveyor, wherein the first voltage is different from the second voltage such that said first and second voltages generate said electric field.

5. The system of claim 1,
   wherein the patterned liquid feature comprises a curable polymer, and
   wherein said means for solidifying the patterned liquid feature comprises one of an Ultra Violet (UV) curing system, a visible light curing system, and a focused thermal curing system.

6. A system for producing a micro-scale patterned structure, the system comprising:
   a first conveyor having a first surface constrained to move along a first path;
   a second conveyor having a second surface constrained to move along a second path, the first and second paths being arranged such that a minimum distance defined between the first and second surfaces occurs in a gap region;
   means for moving the first and second conveyors at matching speeds such that a first surface region of the first surface passes through said gap region substantially simultaneously with a corresponding second surface region of said second surface;
   means for disposing a curable liquid thin film on the first surface region such that a first portion of said curable liquid thin film is disposed on the first surface region when the first surface region is located upstream from the gap region;
   means for generating an electric field between the first conveyor and the second conveyor such that said first portion of the liquid thin film disposed on said first surface region undergoes Electrohydrodynamic (EHD) patterning deformation during passage of said first surface region through the gap region such that the first portion forms a patterned liquid feature having a micro-scale patterned shape; and
   means for solidifying the patterned liquid feature to form said solid micro-scale patterned structure having said micro-scale patterned shape,
   wherein said means for generating said electric field comprises means for causing a plurality of said patterned liquid features to separate from each other on said first surface,
   wherein said means for solidifying the patterned liquid feature comprises means for solidifying said plurality of said patterned liquid features to form a plurality of said solid micro-scale patterned structures disposed in a spaced-apart arrangement on the first surface, and
   wherein said system further comprises means for separating said plurality of solid micro-scale patterned structures from the first surface.

7. The system of claim 1, wherein the first and second conveyors and the second conveyor comprise first and second rollers and defining said gap region therebetween.

8. The system of claim 7, wherein said means for solidifying the patterned liquid feature comprises means for directing energy from one of an Ultra Violet (UV) curing system, a visible light curing system, and a focused thermal curing system onto said patterned liquid feature at a location adjacent to said gap region.

9. The system of claim 1, wherein the first and second conveyors comprise a first belt conveyor structure and a second belt conveyor structure defining said gap region therebetween.

10. The system of claim 9, wherein said means for solidifying the patterned liquid polymer feature comprises one of an Ultra Violet (UV) light source, a visible light source and a heat source disposed inside one of said first and second belt conveyor structures.

11. The system of claim 9, wherein each of said first and second belt conveyor structures further comprises a support structure defining one or more T-shaped grooves, and wherein each of said first and second belt conveyor structures further comprises one or more T-shaped ribs that is slidably received in said one or more T-shaped grooves.

12. The system of claim 1, wherein the means for generating an electric field comprises a dynamic charge generation mechanism that generates a variable charge pattern on at least one of said first surface and said second surface.

13. The system of claim 12, wherein said dynamic charge generation mechanism comprises a plurality of segmented electrodes disposed on the second conveyor, and means for individually accessing each of the plurality of segmented electrodes and for transmitting an associated voltage to each of the plurality of segmented electrodes.

14. The system of claim 12, wherein said second conveyor comprises one of an insulating and semiconducting material layer, and said dynamic charge generation mechanism comprises a charge generating device disposed to apply said variable charge pattern on said layer.

15. A system for producing a plurality of micro-scale patterned structures, the system comprising:
a first conveyor having a first surface constrained to move along a first path;
a second conveyor having a second surface constrained to move along a second path, the first and second paths being arranged such that a minimum distance defined between the first and second surfaces occurs in an elongated gap region;
means for disposing a melted polymer thin film on the first surface at a point located upstream from the elongated gap region such that subsequent movement of the first surface conveys the polymer thin film through the elongated gap region; and
means for generating an electric field between the first conveyor and the second conveyor in the gap region such that said melted polymer film undergoes Electrohydrodynamic (EHD) patterning deformation during passage through the gap region such that said EHD patterning deformation forms a plurality of patterned liquid polymer features having a micro-scale patterned shape,
wherein subsequent cooling of said patterned liquid polymer features at a point located downstream from the elongated gap region causes said plurality of patterned liquid polymer features to solidify such that said plurality of solid micro-scale patterned structures having said micro-scale patterned shape is formed, and
wherein each of said first and second conveyors further comprises a support structure defining one or more T-shaped grooves, and wherein each of said first and second conveyors further comprises one or more T-shaped ribs that is slidably received in said one or more T-shaped grooves.

16. The system of claim 15, wherein the first and second conveyors comprise first and second belt conveyor structures defining said elongated gap region.

17. A system for producing a plurality of micro-scale patterned structures, the system comprising:
a first conveyor having a first surface constrained to move along a first path;
a second conveyor having a second surface constrained to move along a second path, the first and second paths being arranged such that a minimum distance defined between the first and second surfaces occurs in a gap region;
means for disposing a polymer thin film on the first surface at a point located upstream from the gap region such that subsequent movement of the first surface conveys the polymer thin film through the gap region;
a dynamic charge generation mechanism that generates a variable charge pattern on at least one of said first surface and said second surface such that the variable charge pattern generates an electric field between the first conveyor and the second conveyor in the gap region that causes the liquid polymer thin film to undergo Electrohydrodynamic (EHD) patterning deformation that forms a plurality of patterned liquid polymer features having a micro-scale patterned shape; and
means for solidifying the liquid polymer thin film after it undergoes Electrohydrodynamic (EHD) patterning deformation to form said plurality of micro-scale patterned structures having said micro-scale patterned shape,
wherein said dynamic charge generation mechanism comprises a plurality of segmented electrodes disposed on the second conveyor, and means for individually accessing each of the plurality of segmented electrodes and for transmitting an associated charge to each of the plurality of segmented electrodes.

18. A system for producing a plurality of micro-scale patterned structures, the system comprising:
a first conveyor having a first surface constrained to move along a first path;
a second conveyor having a second surface constrained to move along a second path, the first and second paths being arranged such that a minimum distance defined between the first and second surfaces occurs in a gap region;
means for disposing a polymer thin film on the first surface at a point located upstream from the gap region such that subsequent movement of the first surface conveys the polymer thin film through the gap region;
a dynamic charge generation mechanism that generates a variable charge pattern on at least one of said first surface and said second surface such that the variable charge pattern generates an electric field between the first conveyor and the second conveyor in the gap region that causes the liquid polymer thin film to undergo Electrohydrodynamic (EHD) patterning deformation that forms a plurality of patterned liquid polymer features having a micro-scale patterned shape; and
means for solidifying the liquid polymer thin film after it undergoes Electrohydrodynamic (EHD) patterning deformation to form said plurality of micro-scale patterned structures having said micro-scale patterned shape, wherein said second conveyor comprises one of an insulating and semiconducting material layer, and said dynamic charge generation mechanism comprises a first charge generating device disposed to apply first charges in a predetermined pattern on said layer.

* * * * *